(12) United States Patent
Kurita et al.

(10) Patent No.: US 7,471,099 B2
(45) Date of Patent: Dec. 30, 2008

(54) SEMICONDUCTOR DEVICE WITH MECHANISM FOR LEAK DEFECT DETECTION

(75) Inventors: Yuji Kurita, Kasugai (JP); Hiroyoshi Yamashita, Kawasaki (JP); Hitoaki Nishiwaki, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 296 days.

(21) Appl. No.: 11/085,144

(22) Filed: Mar. 22, 2005

(65) Prior Publication Data

US 2006/0139822 A1 Jun. 29, 2006

(30) Foreign Application Priority Data

Dec. 24, 2004 (JP) ............................. 2004-374315

(51) Int. Cl.
*G01R 31/02* (2006.01)
(52) U.S. Cl. .................................................. 324/763
(58) Field of Classification Search ...................... None
See application file for complete search history.

(56) References Cited

U.S. PATENT DOCUMENTS

| | | | | |
|---|---|---|---|---|
| 5,068,604 A * | 11/1991 | Van de Lagemaat | ........ | 324/537 |
| 5,513,186 A * | 4/1996 | Levitt | ........ | 714/727 |
| 5,699,554 A * | 12/1997 | Vajapey | ........ | 714/724 |
| 5,880,623 A * | 3/1999 | Levinson | ........ | 327/540 |
| 5,978,197 A * | 11/1999 | Chan | ........ | 324/686 |
| 6,031,778 A * | 2/2000 | Makino et al. | ........ | 327/537 |
| 6,115,763 A * | 9/2000 | Douskey et al. | ........ | 714/727 |
| 6,525,587 B2 * | 2/2003 | Makino | ........ | 327/292 |
| 6,643,162 B2 * | 11/2003 | Takeuchi et al. | ........ | 327/530 |
| 6,765,429 B2 * | 7/2004 | Miyagi | ........ | 327/534 |
| 6,927,590 B2 * | 8/2005 | Iadanza | ........ | 324/763 |
| 7,020,819 B2 * | 3/2006 | Shin | ........ | 714/727 |
| 2002/0129310 A1 * | 9/2002 | Shin | ........ | 714/727 |
| 2003/0184364 A1 * | 10/2003 | Miyagi | ........ | 327/544 |
| 2007/0001697 A1 * | 1/2007 | Dobberpuhl et al. | ........ | 324/763 |

FOREIGN PATENT DOCUMENTS

| | | |
|---|---|---|
| JP | 07-098359 A | 4/1995 |
| JP | 07-225258 A | 8/1995 |
| JP | 10-082834 A | 3/1998 |
| JP | 2000-111617 A | 4/2000 |

OTHER PUBLICATIONS

English translation of JP-07-098359A.*
English translation of JP-07-225258A.*
English translation of JP-10-082834A.*

* cited by examiner

*Primary Examiner*—Jermele M Hollington
(74) *Attorney, Agent, or Firm*—Arent Fox LLP.

(57) ABSTRACT

A semiconductor device includes a plurality of signal terminals, a first power supply terminal, a second power supply terminal, a core circuit coupled to the plurality of signal terminals and the first power supply terminal, a plurality of first transistors coupled between the respective signal terminals and the second power supply terminal, and a plurality of second transistors coupled between the respective signal terminals and a ground potential, wherein the core circuit is configured to make the first transistors conductive and nonconductive alternately and make the second transistors nonconductive and conductive alternately at a time of test operation, such that one of a first transistor and a second transistor being conductive with respect to a given signal terminal requires another one of the first transistor and the second transistor to be nonconductive with respect to the given signal terminal.

10 Claims, 9 Drawing Sheets

FIG.5

| STATE | INPUT | | | | | | | | | | | | OUTPUT | | | |
|---|---|---|---|---|---|---|---|---|---|---|---|---|---|---|---|---|
| | TestEN | TestOdd | TestEven | Data-1 | EN-1 | Data-2 | EN-2 | Data-3 | EN-3 | Data-4 | EN-4 | TERMINAL1 | TERMINAL2 | TERMINAL3 | TERMINAL4 |
| LEAK TEST1 (TERMINAL1,3:H 2,4:L) | H | H | L | X | X | X | X | X | X | X | X | H | L | H | L |
| LEAK TEST2 (TERMINAL1,3:L 2,4:H) | H | L | H | X | X | X | X | X | X | X | X | L | H | L | H |
| OUTPUT DISABLED (HI-Z) | L | X | X | X | L | X | L | X | L | X | L | Z | Z | Z | Z |
| HIGH OUTPUT | L | X | X | H | H | H | H | H | H | H | H | H | H | H | H |
| LOW OUTPUT | L | X | X | L | H | L | H | L | H | L | H | L | L | L | L |

LEAK TEST MODE: LEAK TEST1, LEAK TEST2
NORMAL OPERATION MODE: OUTPUT DISABLED (HI-Z), HIGH OUTPUT, LOW OUTPUT

FIG.7

| | STATE | INPUT | | | | | | | | | | | OUTPUT | | | |
|---|---|---|---|---|---|---|---|---|---|---|---|---|---|---|---|---|
| | | TestEN | TestOdd | TestEven | Data-1 | EN-1 | Data-2 | EN-2 | Data-3 | EN-3 | Data-4 | EN-4 | TERMINAL1 | TERMINAL2 | TERMINAL3 | TERMINAL4 |
| LEAK TEST MODE | LEAK TEST1 (TERMINAL1,3:H 2,4:L) | H | H | L | X | X | X | X | X | X | X | X | H | L | H | L |
| | LEAK TEST2 (TERMINAL1,3:L 2,4:H) | H | L | H | X | X | X | X | X | X | X | X | L | H | L | H |
| NORMAL OPERATION MODE | OUTPUT DISABLED (HI-Z) | L | L | L | X | L | X | L | X | L | X | L | Z | Z | Z | Z |
| | HIGH OUTPUT | L | L | L | H | H | H | H | H | H | H | H | H | H | H | H |
| | LOW OUTPUT | L | L | L | L | H | L | H | L | H | L | H | L | L | L | L |

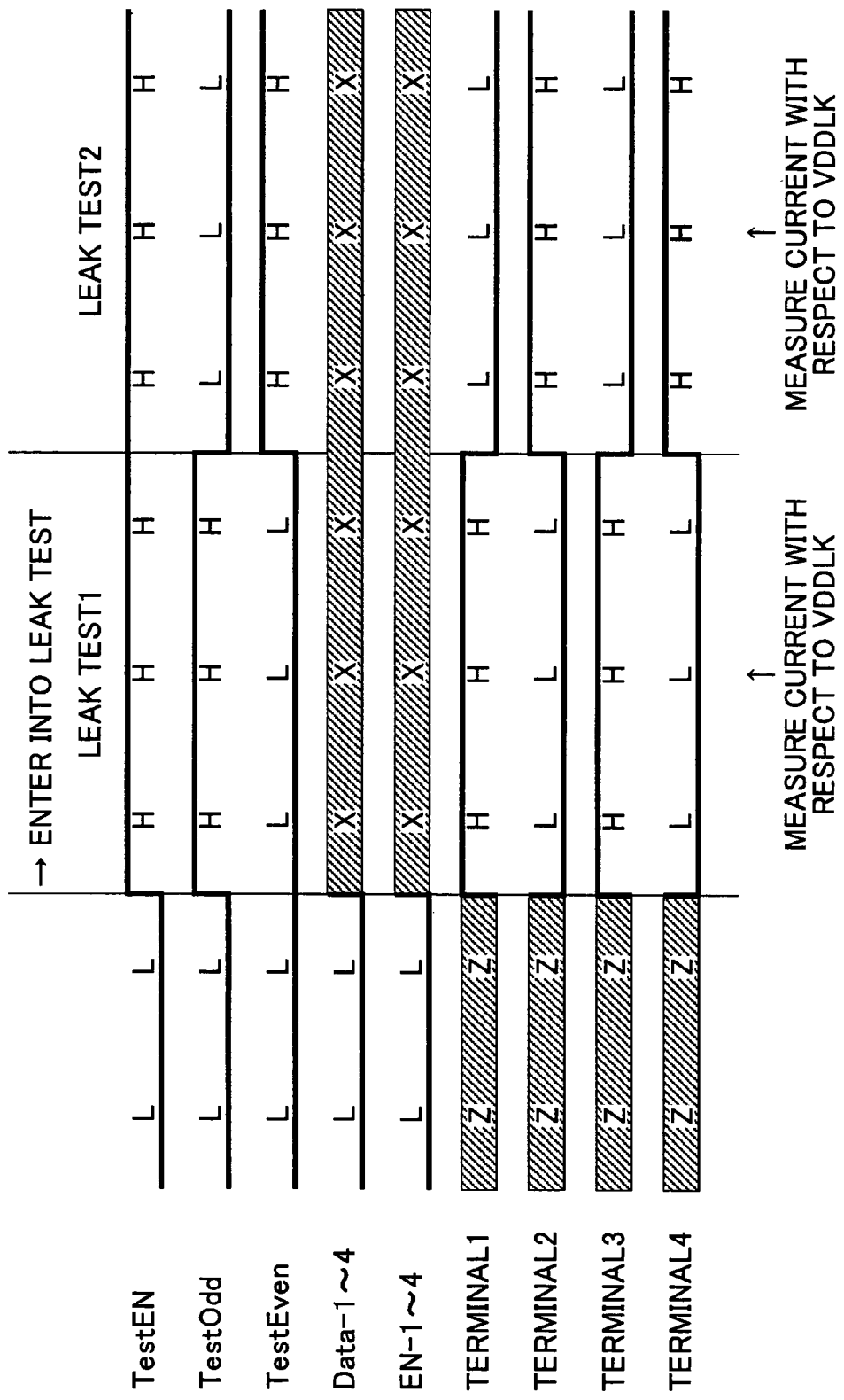

US 7,471,099 B2

SEMICONDUCTOR DEVICE WITH MECHANISM FOR LEAK DEFECT DETECTION

CROSS-REFERENCE TO RELATED APPLICATIONS

The present application is based upon and claims the benefit of, priority from the prior Japanese Patent Application No. 2004-374315 filed on Dec. 24, 2004, with the Japanese Patent Office, the entire contents of which are incorporated herein by reference.

BACKGROUND OF THE INVENTION

1. Field of the Invention

The present invention generally relates to semiconductor devices, and particularly relates to a semiconductor device provided with test functions.

2. Description of the Related Art

The SiP (system in package) structure has a configuration in which a plurality of LSI (large scale integrated circuit) chips are provided and connected together inside a single package. FIGS. 1A and 1B are drawings showing an example of the SiP configuration. FIG. 1A illustrates a side view of an SiP, and FIG. 1B shows a plan view of the SiP. The SiP has a structure in which a first chip 10 and a second chip 11 are sealed inside a package 12. This structure provides a highly functional, small-sized semiconductor device.

In the SiP shown in FIG. 1B, the first chip 10 and the second chip 11 have internally-confined terminals 13 and external-connection terminals 14. The internally-confined terminals 13 serve to connect between the first chip 10 and the second chip 11, and are sealed inside the package 12 so that no access from the exterior can be made. The external-connection terminals 14 are connected to the exterior of the package 12 so as to allow access to be made to the first chip 10 and the second chip 11 from the exterior of the package 12.

Generally, tests conducted at the time of shipment of LSIs need to make sure that no leak defect is present between LSI terminals. This is done by applying a voltage between adjacent terminals-subjected to inspection and by measuring a current flowing between these terminals so as to check whether a leak current is present between the terminals, i.e., whether there is a leak defect.

In the case of the SiP as illustrated in FIG. 1, no access can be made from the exterior of the package to the terminals (internally-confined terminals 13) that provide couplings between the chips inside the package and for which there is no need to exchange signals with the exterior. There is thus a problem that the measurement of leak currents between these terminals cannot be made. In order to conduct a leak defect test with respect to these terminals, either these terminals for which there is no need for external connection should be connected to the exterior or there is a need for a method of measuring inter-terminal leak currents without accessing these terminals from the exterior.

As a method of detecting a leak current without accessing terminals from an exterior, it is conceivable to set the outputs of the terminals equal to HIGH and LOW alternately and to monitor the power supply current consumed by the LSI core. FIG. 2 is a drawing for explaining a method of detecting a leak defect of internally-confined terminals. In FIG. 2, the first chip 10 and the second chip 11 include core circuits 20 and 21, respectively. The core circuits 20 and 21 are coupled to each other via the internally-confined terminals 13, and the core circuit 20 transmits signals to the core circuit 21 via output buffers 22.

In FIG. 2, two adjacent terminals are connected to each other through an inter-terminal short-circuit defect A. With one of these terminals set to HIGH and the other set to LOW, a leak current i2 flows through the inter-terminal short-circuit defect A. A power supply voltage VDD supplied from the exterior of the package 12 to a power supply terminal 23 is monitored to detect an increase caused by the leak current i2, thereby detecting a short-circuit between terminals.

Patent Document 1 discloses providing a means to supply power separately to all the bear chips on a multi-chip circuit board, and teaches a test procedure by which power is supplied only to a bear chip to be tested among the plurality of bear chips while no power is supplied to the remaining bear chips.

[Patent Document 1] Japanese Patent Application Publication No. 2000-111617

In the method of detecting a leak current by monitoring a power supply current as shown in FIG. 2, a current i1 consumed in the core circuit and the leak current i2 are combined together when they are measured. In general, most leak defects are not a complete short-circuit between terminals, but are rather a high-resistance connection between terminals. In such a case, the leak current i2 has a small current amount compared with the current i1 consumed by the core circuit. When current consumption increases due to a leak during the monitoring of consolidated current consumption, therefore, it is difficult to decide whether the increase in the current consumption is caused by a leak or caused by fluctuation of currents consumed by the core circuit.

Accordingly, there is a need for a semiconductor device which can detect an inter-terminal leak defect reliably without accessing terminals.

SUMMARY OF THE INVENTION

It is a general object of the present invention to provide a semiconductor device that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor device particularly pointed out in the specification in such full, clear, concise, and exact terms as to enable a person having ordinary skill in the art to practice the invention.

To achieve these and other advantages in accordance with the purpose of the invention, the invention provides a semiconductor device which includes a plurality of signal terminals, a first power supply terminal, a second power supply terminal, a core circuit coupled to the plurality of signal terminals and the first power supply terminal, a plurality of first transistors coupled between the respective signal terminals and the second power supply terminal, and a plurality of second transistors coupled between the respective signal terminals and a ground potential, wherein the core circuit is configured to make the first transistors conductive and nonconductive alternately and make the second transistors nonconductive and conductive alternately at a time of test operation, such that one of a first transistor and a second transistor being conductive with respect to a given signal terminal requires another one of the first transistor and the second transistor to be nonconductive with respect to the given signal terminal.

According to at least one embodiment of the present invention, the first transistors receiving power supply from the second power supply terminal and the second transistors coupled to the ground are made conductive and nonconductive alternately, thereby assigning the signal terminals to alternating HIGH and LOW. The second power supply terminal is independent of the first power supply terminal for driving the core circuit. Because of this, the amount of a current via the second power supply terminal is almost zero if there is no inter-terminal short-circuit defect. By detecting a current flowing via the second power supply terminal, therefore, the fact that a leak current is caused by an inter-terminal short-circuit defect can be reliably ascertained when such a leak current exists.

BRIEF DESCRIPTION OF THE DRAWINGS

Other objects and further features of the present invention will be apparent from the following detailed description when read in conjunction with the accompanying drawings, in which:

FIG. 5 is a table chart showing allocation of logic values to the terminals of the semiconductor device of the second embodiment shown in FIG. 4 in the case of test operation and in the case of normal operation;

FIG. 7 is a table chart showing allocation of logic values to the terminals of the semiconductor device of the third embodiment shown in FIG. 6 in the case of test operation and in the case of normal operation;

FIG. 8 is a timing chart showing an example of signal patterns at the time of test operation with respect to the second and third embodiments.

DESCRIPTION OF THE PREFERRED EMBODIMENTS

In the following, embodiments of the present invention will be described with reference to the accompanying drawings.

Figure 1A:
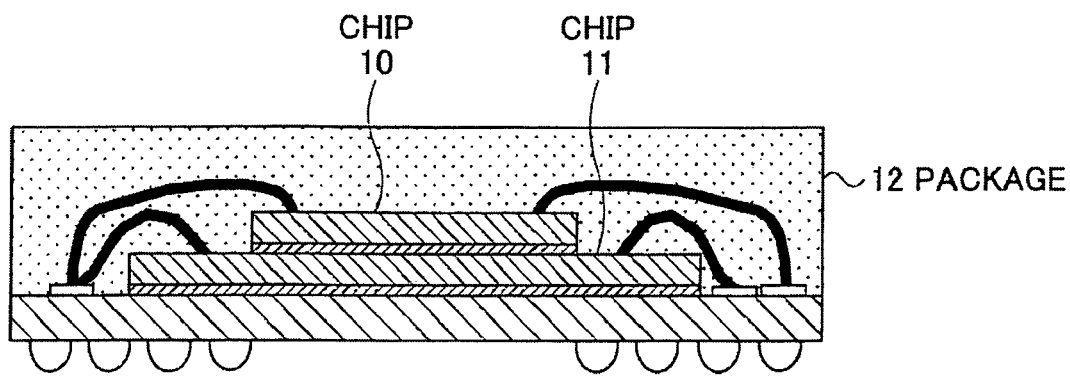
FIGS. 1A and 1B are drawings showing an example of an SiP configuration.
Figure 1B:
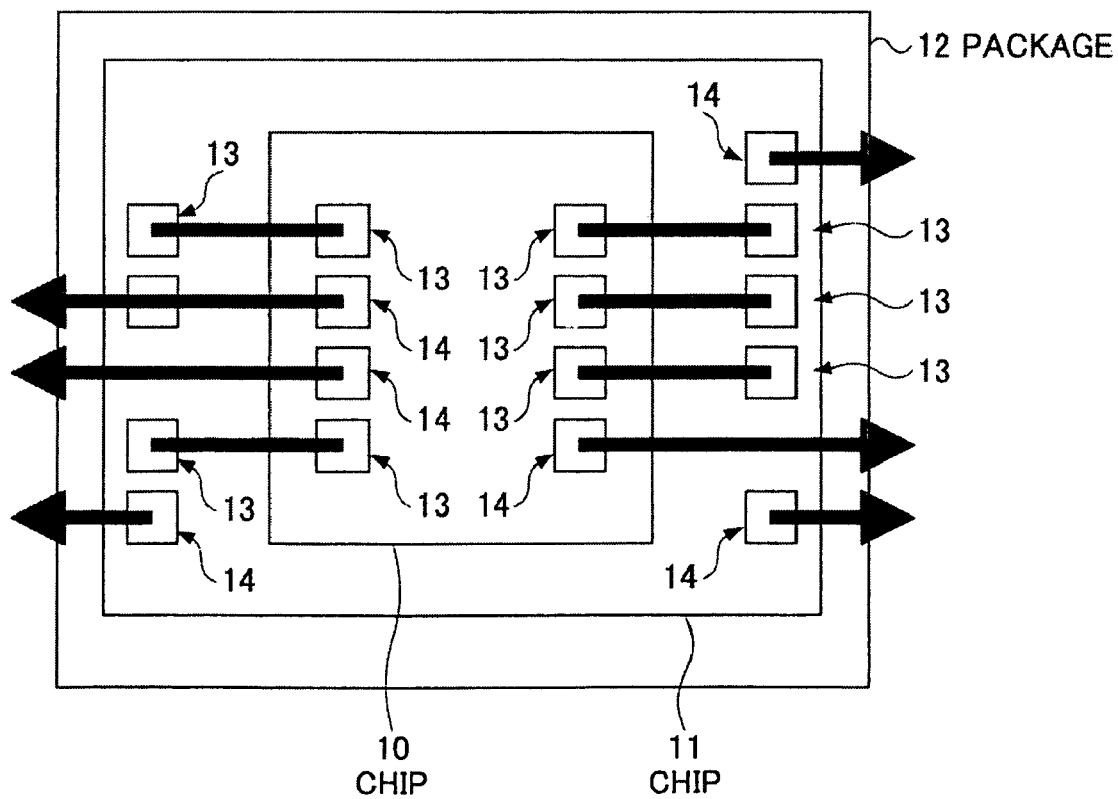
Figure 2:
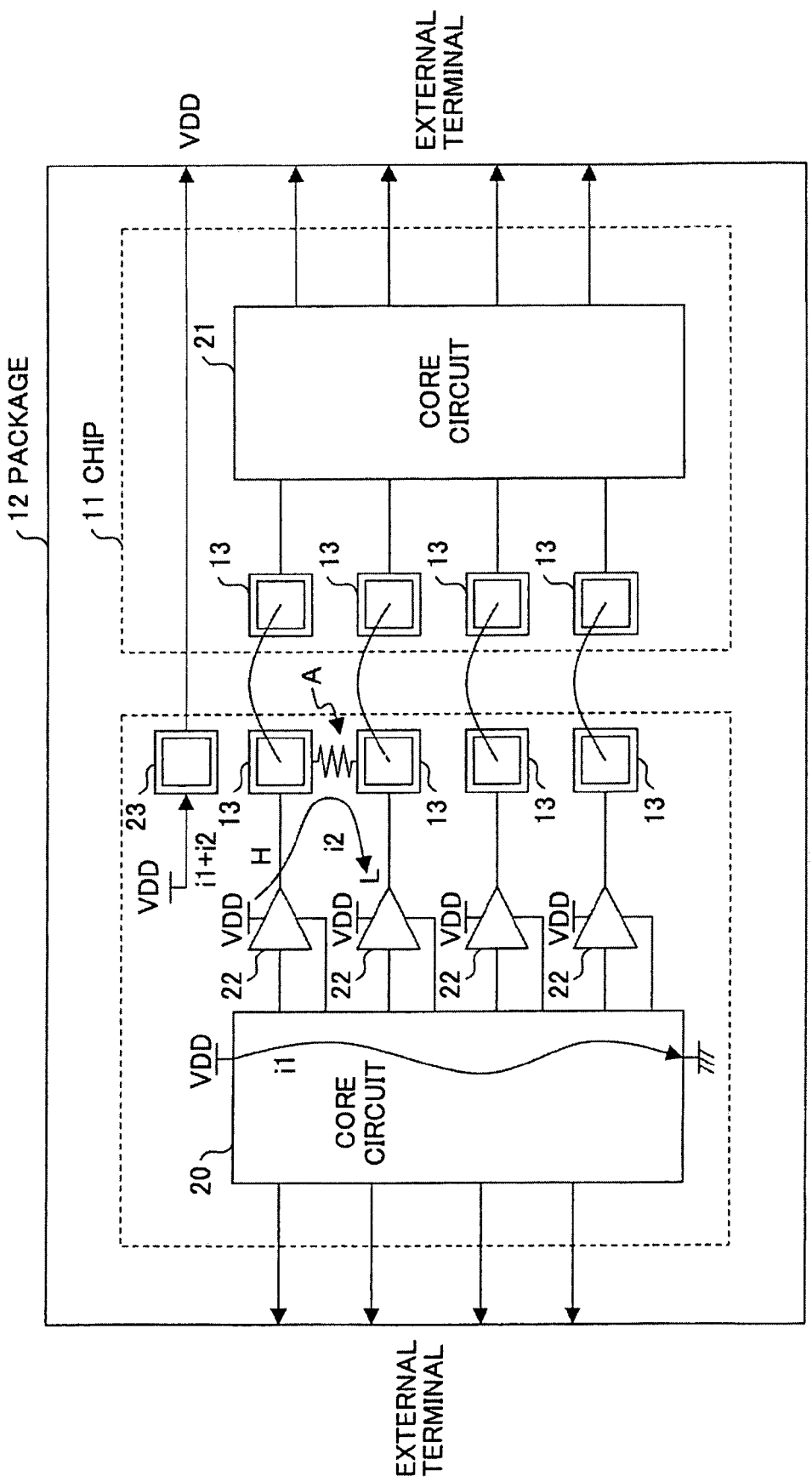
FIG. 2 is a drawing for explaining a method of detecting a leak defect of internally-confined terminals.
Figure 3:
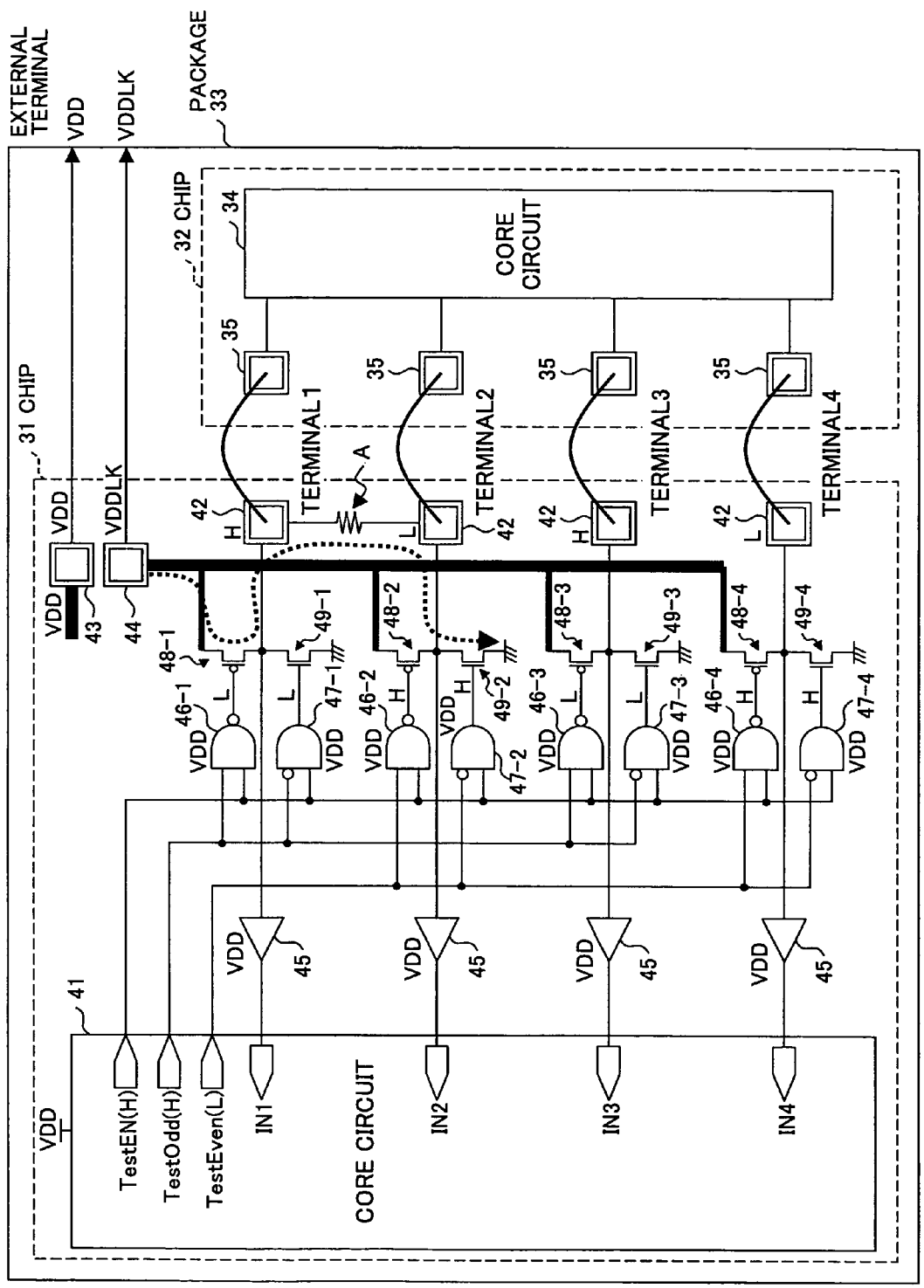
FIG. 3 is a circuit diagram showing an example of the configuration of a first embodiment of a semiconductor device according to the present invention.

FIG. 3 is a circuit diagram showing an example of the configuration of a first embodiment of a semiconductor device according to the present invention. The semiconductor device of FIG. 3 is an SiP having a first chip 31 and a second chip 32 provided inside a package 33.

The second chip 32 includes a core circuit 34 and a plurality of internally-confined terminals 35. The internally-confined terminals 35 are connected to the first chip 31.

The first chip 31 includes a core circuit 41, a plurality of internally-confined terminals 42, a power supply terminal 43 to which a power supply voltage VDD is supplied from an exterior, a power supply terminal 44 to which a power supply voltage VDDLK is supplied from an exterior, a plurality of input buffers 45 connected to the internally-confined terminals 42, NAND gates 46-1 through 46-4, AND gates 47-1 through 47-4 with one of their two inputs being a negative logic input, PMOS transistors 48-1 through 48-4, and NMOS transistors 49-1 through 49-4. The example shown in FIG. 3 illustrates four internally-confined terminals 42 and a corresponding circuit configuration. This number is not a limiting example, and may be any other number.

The internally-confined terminals 42 are input terminals. Signals supplied from the second chip 32 are supplied as input signals IN1 through IN4 to the core circuit 41 via the input buffers 45. The PMOS transistors 48-1 through 48-4 and the NMOS transistors 49-1 through 49-4 serve to set the internally-confined terminals 42 to HIGH or LOW at the time of testing. The core circuit 41 sets a test enable signal TestEN, an odd-number test signal TestOdd, and an even-number test signal TestEven, thereby controlling the conductive/nonconductive state of the above-noted transistors via the NAND gates 46-1 through 46-4 and the AND gates 47-1 through 47-4.

At the time of normal operation, the test enable signal TestEN is set to LOW. Accordingly, the outputs of the NAND gates 46-1 through 46-4 become HIGH, making the PMOS transistors 48-1 through 48-4 nonconductive. Further, the outputs of the AND gates 47-1 through 47-4 become LOW, thereby making the NMOS transistors 49-1 through 49-4 nonconductive. Namely, signals input into the internally-confined terminals 42 are supplied without any change to the core circuit 41 via the input buffers 45 at the time of normal operation.

At the time of test operation, the test enable signal TestEN is set to HIGH. When a test is to be conducted by using odd-number terminals as the plus side, the odd-number test signal TestOdd is set to HIGH, and the even-number test signal TestEven is set to LOW. As a result, as shown in FIG. 3, the outputs of the NAND gates 46-1 through 46-4 are set to LOW, HIGH, LOW, and HIGH, respectively, and the outputs of the AND gates 47-1 through 47-4 are set to LOW, HIGH, LOW, and HIGH, respectively. As a result, the PMOS transistors 48-1 through 48-4 are made conductive, nonconductive, conductive, and nonconductive, respectively, and the NMOS transistors 49-1 through 49-4 are made nonconductive, conductive, nonconductive, and conductive, respectively. Namely, the internally-confined terminals 42 are set to HIGH and LOW alternately.

As shown in FIG. 3, the first internally-confined terminal 42 (TERMINAL1) and the second internally-confined terminal 42 (TERMINAL2) have an inter-terminal short-circuit defect A therebetween. In this case, therefore, a leak current flows from the power supply voltage VDDLK to the ground through the conductive PMOS transistor 48-1, the inter-terminal short-circuit defect A, and the conductive NMOS transistor 49-2. The power supply terminal 44 for supplying the power supply voltage VDDLK is separate from and independent of the power supply terminal 43 used for driving the core circuit 41 and the like. Because of this, the amount of a current flow with respect to the power supply voltage VDDLK is almost zero if there is no inter-terminal short-circuit defect A. By detecting a current flow with respect to the power supply voltage VDDLK, therefore, the fact that a leak current is caused by an inter-terminal short-circuit defect A can be reliably ascertained when such a leak current exists.

When a test is to be conducted by using the even-number terminals as the plus side, the even-number test signal TestEven is set to HIGH, and the odd-number test signal TestOdd is set to LOW. With these settings, the outputs of the NAND gates 46-1 through 46-4 are set to HIGH, LOW, HIGH, and LOW, respectively, and the outputs of the AND gates 47-1 through 47-4 are set to HIGH, LOW, HIGH, and LOW, respectively. As a result, the PMOS transistors 48-1 through 48-4 are made nonconductive, conductive, nonconductive, and conductive, respectively, and the NMOS transistors 49-1 through 49-4 are made conductive, nonconductive, conductive, and nonconductive, respectively. Namely, the internally-confined terminals 42 are set to LOW and HIGH alternately.

In the same manner as previously described, if an inter-terminal short-circuit defect A exists, a leak current flows from the power supply voltage VDDLK to the ground through the conductive PMOS transistor, the inter-terminal short-circuit defect A, and the conductive NMOS transistor. By detecting a current flow with respect to the power supply voltage VDDLK, therefore, the fact that a leak current is caused by an inter-terminal short-circuit defect A can be reliably ascertained when such a leak current exists.

Figure 4:
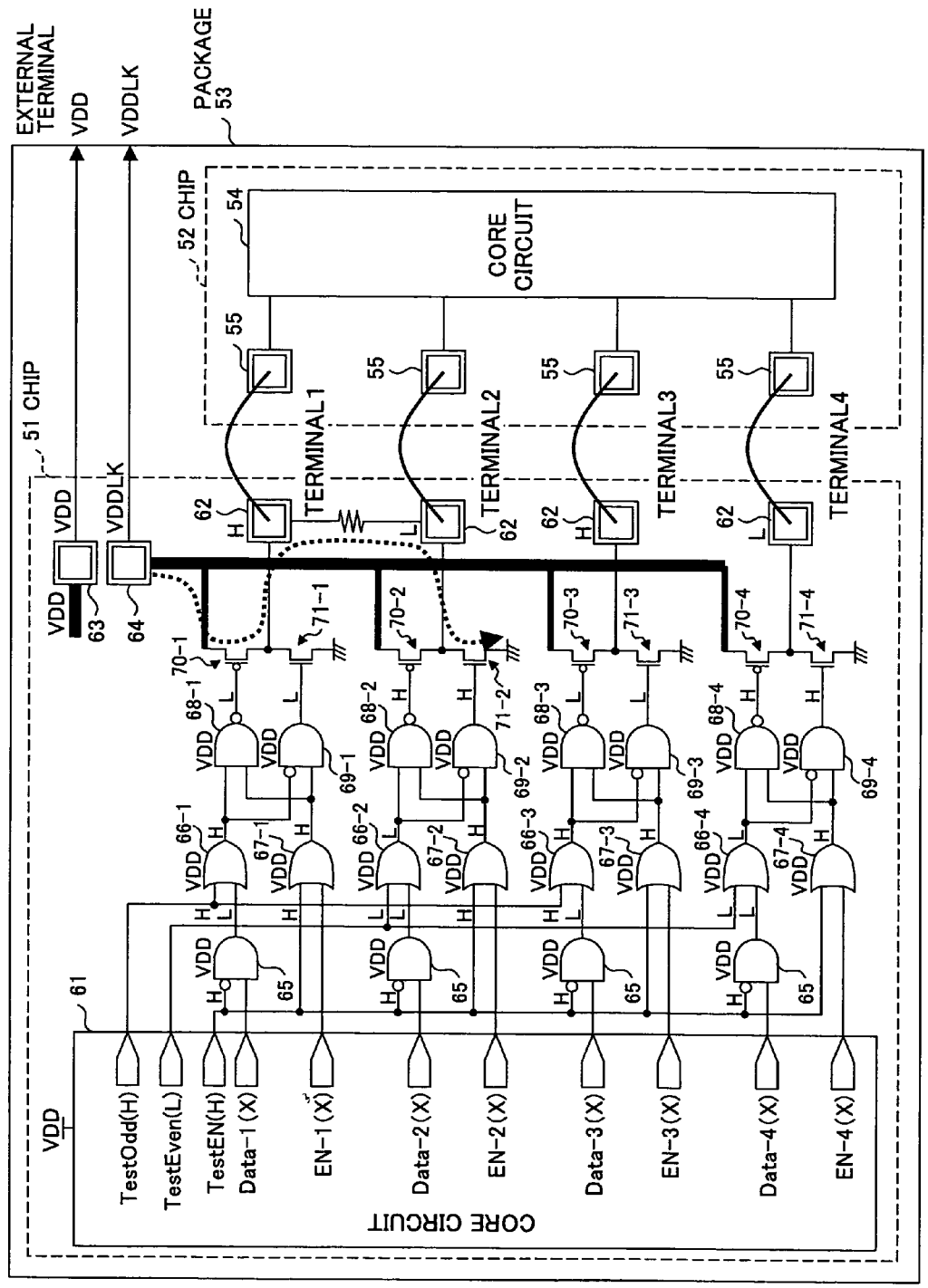
FIG. 4 is a circuit diagram showing an example of the configuration of a second embodiment of the semiconductor device according to the present invention.

FIG. 4 is a circuit diagram showing an example of the configuration of a second embodiment of the semiconductor device according to the present invention. The semiconductor device shown in FIG. 4 is an SiP, which includes a first chip 51 and a second chip 52 provided inside a package 53.

The second chip 52 includes a core circuit 54 and a plurality of internally-confined terminals 55. The internally-confined terminals 55 are connected to the first chip 51.

The first chip 51 includes a core circuit 61, a plurality of internally-confined terminals 62, a power supply terminal 63 to which a power supply voltage VDD is supplied from an exterior, a power supply terminal 64 to which a power supply voltage VDDLK is supplied from an exterior, a plurality of AND gates 65 with one of their two inputs being a negative logic input, OR gates 66-1 through 66-4, OR gates 67-1 through 67-4, NAND gates 68-1 through 68-4, AND gates 69-1 through 69-4 with one of their two inputs being a negative logic input, PMOS transistors 70-1 through 70-4, and NMOS transistors 71-1 through 71-4. The example shown in FIG. 4 illustrates four internally-confined terminals 62 and a corresponding circuit configuration. This number is not a limiting example, and may be any other number.

The internally-confined terminals 62 are output terminals. Data signals Data-1 through Data-4 output from the core circuit 61 are transmitted from the internally-confined terminals 62 to the second chip 52 after propagating through the AND gates 65, the OR gates 66-1 through 66-4, the NAND gates 68-1 through 68-4, the AND gates 69-1 through 69-4, and output circuits comprised of the PMOS transistors 70-1 through 70-4 and the NMOS transistors 71-1 through 71-4. Output enable signals EN-1 through EN-4 output from the core circuit 61 are set to LOW when there is a need to place the internally-confined terminals 62 in a floating state, and are set to HIGH during normal data output operations. The core circuit 61 sets a test enable signal TestEN, an odd-number test signal TestOdd, and an even-number test signal TestEven, thereby controlling the conductive/nonconductive state of the PMOS transistors 70-1 through 70-4 and the NMOS transistors 71-1 through 71-4.

At the time of normal operation, the test enable signal TestEN, the odd-number test signal TestOdd, and the even-number test signal TestEven are all set to LOW. Further, as described above, the output enable signals EN-1 through EN-4 are set to HIGH. Accordingly, the data signals Data-1 through Data-4 pass through the AND gates 65 and the OR gates 66-1 through 66-4 without any change, and are inverted by the NAND gates 68-1 through 68-4 or the AND gates 69-1 through 69-4 having a negative logic input, followed by being further inverted by the output circuits (inverters) comprised of the PMOS transistors 70-1 through 70-4 and the NMOS transistors 71-1 through 71-4 for transmission from the internally-confined terminals 62. In this case, the power supply voltage VDDLK is set to the same voltage as the power supply voltage VDD.

At the time of test operation, the test enable signal TestEN is set to HIGH. When a test is to be conducted by using odd-number terminals as the plus side, the odd-number test signal TestOdd is set to HIGH, and the even-number test signal TestEven is set to LOW. As a result, as shown in FIG. 4, the outputs of the NAND gates 68-1 through 68-4 are set to LOW, HIGH, LOW, and HIGH, respectively, and the outputs of the AND gates 69-1 through 69-4 are set to LOW, HIGH, LOW, and HIGH, respectively. As a result, the PMOS transistors 70-1 through 70-4 are made conductive, nonconductive, conductive, and nonconductive, respectively, and the NMOS transistors 71-1 through 71-4 are made nonconductive, conductive, nonconductive, and conductive, respectively. Namely, the internally-confined terminals 62 are set to HIGH and LOW alternately.

As shown in FIG. 4, the first internally-confined terminal 62 (TERMINAL1) and the second internally-confined terminal 62 (TERMINAL2) have an inter-terminal short-circuit defect A therebetween. In this case, therefore, a leak current flows from the power supply voltage VDDLK to the ground through the conductive PMOS transistor 70-1, the inter-terminal short-circuit defect A, and the conductive NMOS transistor 71-2. The power supply terminal 64 for supplying the power supply voltage VDDLK is separate from and independent of the power supply terminal 63 used for driving the core circuit 61 and the like. Because of this, the amount of a current flow with respect to the power supply voltage VDDLK is almost zero if there is no inter-terminal short-circuit defect A. By detecting a current flow with respect to the power supply voltage VDDLK, therefore, the fact that a leak current is caused by an inter-terminal short-circuit defect A can be reliably ascertained when such a leak current exists.

When a test is to be conducted by using the even-number terminals as the plus side, the even-number test signal TestEven is set to HIGH, and the odd-number test signal TestOdd is set to LOW. With these settings, the outputs of the NAND gates 68-1 through 68-4 are set to HIGH, LOW, HIGH, and LOW, respectively, and the outputs of the AND gates 69-1 through 69-4 are set to HIGH, LOW, HIGH, and LOW, respectively. As a result, the PMOS transistors 70-1 through 70-4 are made nonconductive, conductive, nonconductive, and conductive, respectively, and the NMOS transistors 71-1 through 71-4 are made conductive, nonconductive, conductive, and nonconductive, respectively. Namely, the internally-confined terminals 62 are set to LOW and HIGH alternately.

In the same manner as previously described, if an inter-terminal short-circuit defect A exists, a leak current flows from the power supply voltage VDDLK to the ground through the conductive PMOS transistor, the inter-terminal short-circuit defect A, and the conductive NMOS transistor. By detecting a current flow with respect to the power supply voltage VDDLK, therefore, the fact that a leak current is caused by an inter-terminal short-circuit defect A can be reliably ascertained when such a leak current exists.

FIG. 5 is a table chart showing allocation of logic values to the terminals of the semiconductor device of the second embodiment shown in FIG. 4 in the case of test operation and in the case of normal operation. As shown in FIG. 5, in a LEAK TEST1 that sets the odd-number internally-confined terminals 62 to HIGH, the test enable signal TestEN, the odd-number test signal TestOdd, and the even-number test signal TestEven are set to HIGH, HIGH, and LOW, respectively. The logic values of the data signals Data-1 through Data-4 and the output enable signals EN-1 through EN-4 are "don't care". In a LEAK TEST2 that sets the even-number internally-confined terminals 62 to HIGH, the test enable signal TestEN, the odd-number test signal TestOdd, and the even-number test signal TestEven are set to HIGH, LOW, and HIGH, respectively. The logic values of the data signals Data-1 through Data-4 and the output enable signals EN-1 through EN-4 are "don't care".

At the time of normal operation, the test enable signal TestEN is set to LOW. Setting the output enable signals EN-1 through EN-4 to LOW results in the outputs being placed in the floating state (high-impedance state). Setting the output enable signals EN-1 through EN-4 to HIGH results in the outputs having signal levels responsive to the data signals Data-1 through Data-4. The odd-number test signal TestOdd and the even-number test signal TestEven are "don't care".

Figure 6:
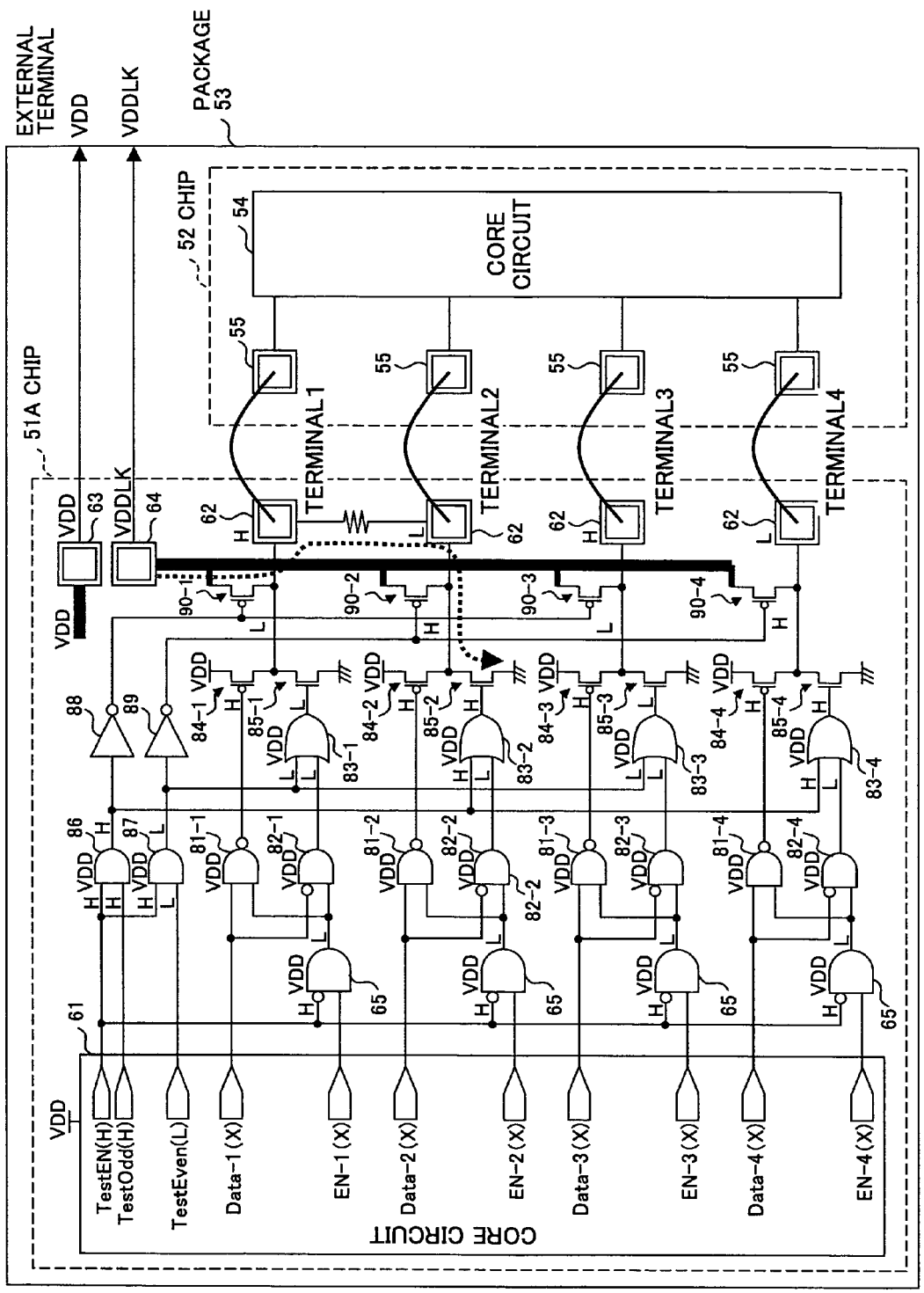
FIG. 6 is a circuit diagram showing an example of the configuration of a third embodiment of the semiconductor device according to the present invention.

FIG. 6 is a circuit diagram showing an example of the configuration of a third embodiment of the semiconductor device according to the present invention. In FIG. 6, the same elements as those of FIG. 4 are referred to by the same numerals, and a description thereof will be omitted unless necessary.

The semiconductor device shown in FIG. 6 is an SiP, and includes a first chip 51A and the second chip 52 provided inside a package 53A. The first chip 51A includes the core circuit 61, the plurality of internally-confined terminals 62, the power supply terminal 63 to which a power supply voltage VDD is supplied from an exterior, the power supply terminal 64 to which a power supply voltage VDDLK is supplied from an exterior, the plurality of AND gates 65 with one of their two inputs being a negative logic input, NAND gates 81-1 through 81-4, AND gates 82-1 through 82-4 with one of their two inputs being a negative logic input, OR gates 83-1 through 83-4, PMOS transistors 84-1 through 84-4, NMOS transistors 85-1 through 85-4, AND gates 86 and 87, inverters 88 and 89, and PMOS transistors 90-1 through 90-4. The example shown in FIG. 6 illustrates four internally-confined terminals 62 and a corresponding circuit configuration. This number is not a limiting example, and may be any other number.

In the second embodiment shown in FIG. 4, the output circuit (the PMOS transistors 70-1 through 70-4 and the NMOS transistors 71-1 through 71-4) used in the normal data output operation is utilized to detect a leak current at the time of test operation. In such a configuration, the PMOS transistors 70-1 through 70-4 and the NMOS transistors 71-1 through 71-4 need to have sufficient output signal drive capability. To this end, the power supply voltage VDDLK needs to be supplied to these transistors through power supply wires having an equivalent thickness to that of the power supply wires used for the power supply voltage VDD. The independent power supply voltage VDDLK and its transmission path are a layout portion that is separate from the power supply voltage VDD and its transmission path, and that becomes necessary only for the purpose of conducting a test operation according to the present invention. If the wires of this layout portion are thick, they may undesirably become a burden on the designing of the entire layout.

In the third embodiment shown in FIG. 6, the PMOS transistors 90-1 through 90-4 for conducting a test operation according to the present invention are provided separately from the output circuits used for the normal output operation, and the power supply voltage VDDLK is supplied to these transistors. The output circuits used for the normal output operation are comprised of the PMOS transistors 84-1 through 84-4 and the NMOS transistors 85-1 through 85-4, which receive the normal power supply voltage VDD through normal power supply paths. With this provision, the PMOS transistors 84-1 through 84-4 and the NMOS transistors 85-1 through 85-4 constituting the output circuits can drive output signals with sufficient drive power.

It suffices to supply a current only for the test purposes to the PMOS transistors 90-1 through 90-4 provided for the test purposes. Thus, the power supply wires for supplying the power supply voltage VDDLK do not have to be thick. In the configuration of the second embodiment shown in FIG. 4, the power supply wires for the power supply voltage VDDLK may need to have a thickness of about 30 to 40 micrometers, for example. In the configuration of the third embodiment shown in FIG. 6, on the other hand, the power supply wires for the power supply voltage VDDLK are sufficiently thick even if their thickness is less than about 5 micrometers. The third embodiment can thus reduce an effect of the layout portion necessary for the purpose of test operation on the designing of the entire layout.

The data output operation and test operation are the same as in the second embodiment. Namely, at the time of normal operation, the test enable signal TestEN, the odd-number test signal TestOdd, and the even-number test signal TestEven are all set to LOW. Further, the output enable signals EN-1 through EN-4 are set to HIGH. With these settings, the data signals Data-1 through Data-4 output from the core circuit 61 are transmitted from the internally-confined terminals 62 to the second chip 52. In this case, the PMOS transistors 90-1 through 90-4 have the gate node thereof receiving HIGH so as to be nonconductive. Accordingly, the PMOS transistors 90-1 through 90-4 do not affect the data output operation in any manner.

At the time of test operation, the test enable signal TestEN is set to HIGH. When a test is to be conducted by using odd-number terminals as the plus side, the odd-number test signal TestOdd is set to HIGH, and the even-number test signal TestEven is set to LOW. As a result, as shown in FIG. 6, the outputs of the NAND gates 81-1 through 81-4 are all set to HIGH, and the outputs of the OR gates 83-1 through 83-4 are set to LOW, HIGH, LOW, and HIGH, respectively. As a result, the PMOS transistors 84-1 through 84-4 are all made nonconductive, and the NMOS transistors 85-1 through 85-4 are made nonconductive, conductive, nonconductive, and conductive, respectively.

Further, based on the test enable signal TestEN, the odd-number test signal TestOdd, and the even-number test signal TestEven, a circuit comprised of the AND gates 86 and 87 and the inverters 88 and 89 sets the gate potentials of the PMOS transistors 90-1 through 90-4 to LOW, HIGH, LOW, and HIGH, respectively. As a result, the PMOS transistors 90-1 through 90-4 are made conductive, nonconductive, conductive, and nonconductive, respectively. Namely, the internally-confined terminals 62 are set to HIGH and LOW alternately.

As shown in FIG. 6, the first internally-confined terminal 62 (TERMINAL1) and the second internally-confined terminal 62 (TERMINAL2) have an inter-terminal short-circuit defect A therebetween. In this case, therefore, a leak current flows from the power supply voltage VDDLK to the ground through the conductive PMOS transistor 90-1, the inter-terminal short-circuit defect A, and the conductive NMOS transistor 85-2. The power supply terminal 64 for supplying the power supply voltage VDDLK is separate from and independent of the power supply terminal 63 used for driving the core circuit 61 and the like. Because of this, the amount of a current flow with respect to the power supply voltage VDDLK is almost zero if there is no inter-terminal short-circuit defect A. By detecting a current flow with respect to the power supply voltage VDDLK, therefore, the fact that a leak current is caused by an inter-terminal short-circuit defect A can be reliably ascertained when such a leak current exists.

When a test is to be conducted by using the even-number terminals as the plus side, the even-number test signal TestEven is set to HIGH, and the odd-number test signal TestOdd is set to LOW. In the same manner as described above, detecting a current flow with respect to the power supply voltage VDDLK makes it possible to detect reliably an inter-terminal short-circuit defect.

FIG. 7 is a table chart showing allocation of logic values to the terminals of the semiconductor device of the third embodiment shown in FIG. 6 in the case of test operation and in the case of normal operation. As shown in FIG. 7, in a LEAK TEST1 that sets the odd-number internally-confined terminals 62 to HIGH, the test enable signal TestEN, the odd-number test signal TestOdd, and the even-number test signal TestEven are set to HIGH, HIGH, and LOW, respectively. The logic values of the data signals Data-1 through Data-4 and the output enable signals EN-1 through EN-4 are "don't care". In a LEAK TEST2 that sets the even-number internally-confined terminals 62 to HIGH, the test enable signal TestEN, the odd-number test signal TestOdd, and the even-number test signal TestEven are set to HIGH, LOW, and HIGH, respectively. The logic values of the data signals Data-1 through Data-4 and the output enable signals EN-1 through EN-4 are "don't care".

At the time of normal operation, the test enable signal TestEN, the odd-number test signal TestOdd, and the even-number test signal TestEven are all set to LOW. Setting the output enable signals EN-1 through EN-4 to LOW results in the outputs being placed in the floating state (high-impedance state). Setting the output enable signals EN-1 through EN-4 to HIGH results in the outputs having signal levels responsive to the data signals Data-1 through Data-4.

FIG. 8 is a timing chart showing an example of signal patterns at the time of test operation with respect to the second and third embodiments. As shown in FIG. 8, the test enable signal TestEN, the odd-number test signal TestOdd, the even-number test signal TestEven, the data signals Data-1 through Data-4, and the output enable signals EN-1 through EN-4 are all set to LOW in the initial state.

After entering into a leak test mode, the test enable signal TestEN, the odd-number test signal TestOdd, the even-number test signal TestEven are set to HIGH, HIGH, and LOW, respectively, for a duration of three clock cycles, for example. During the second clock cycle, for example, a current flow with respect to the power supply voltage VDDLK is measured, thereby detecting a leak current that flows between TERMINAL1 through TREMINAL4 (see FIG. 4 and FIG. 6).

After this, the test enable signal TestEN, the odd-number test signal TestOdd, the even-number test signal TestEven are set to HIGH, LOW, and HIGH, respectively, for a duration of three clock cycles, for example. During the second clock cycle, for example, a current flow with respect to the power supply voltage VDDLK is measured, thereby detecting a leak current that flows between TERMINAL1 through TREMINAL4 (see FIG. 4 and FIG. 6).

Figure 9A:
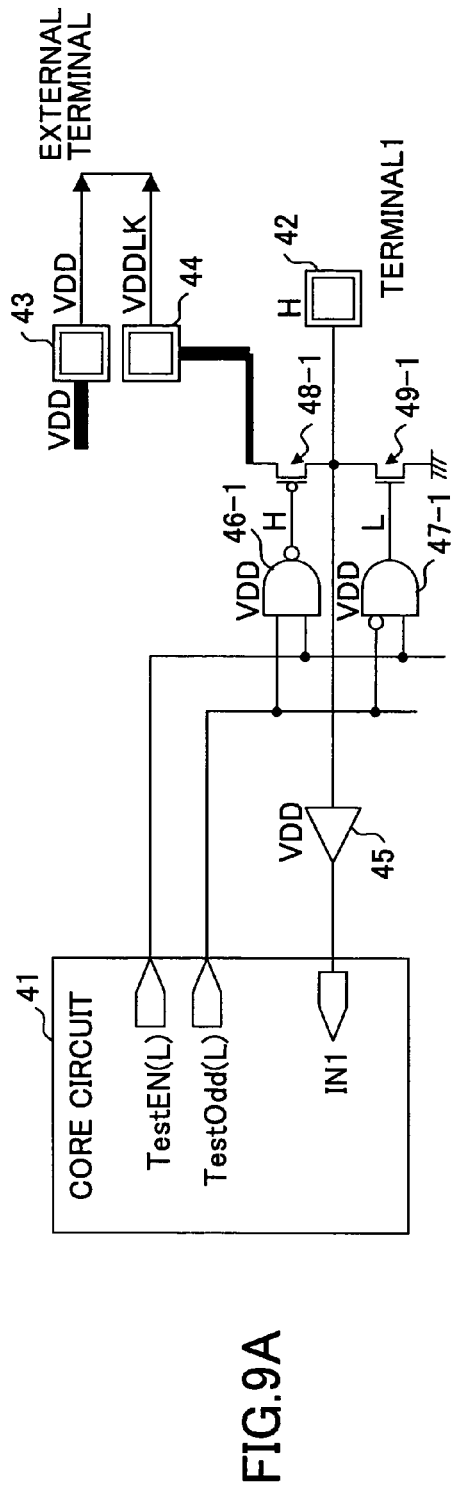
FIGS. 9A through 9C are drawings for explaining a fourth embodiment of the semiconductor device according to the present invention.
Figure 9B:
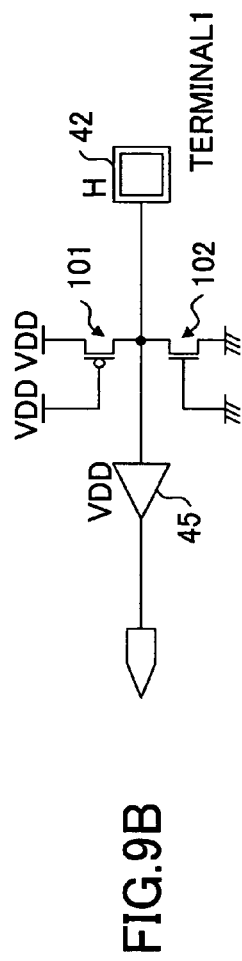
Figure 9C:
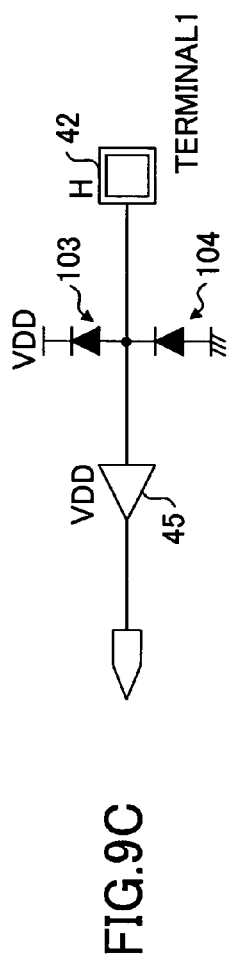

FIGS. 9A through 9C are drawings for explaining a fourth embodiment of the semiconductor device according to the present invention. In FIGS. 9A through 9C, the same elements as those of FIG. 3 are referred to by the same numerals, and a description thereof will be omitted unless necessary.

FIG. 9A illustrates signal settings at the time of normal operation in the configuration of the first embodiment shown in FIG. 3. As illustrated, the core circuit 41 assigns the test enable signal TestEN and the odd-number test signal TestOdd to LOW, thereby setting the gate potential of the PMOS transistor 48-1 to HIGH and the gate potential of the NMOS transistor 49-1 to LOW. With these settings, both the PMOS transistor 48-1 and the NMOS transistor 49-1 become nonconductive, so that data input via the internally-confined terminal 42 is supplied to the core circuit 41 without being affected.

FIG. 9B is a drawing showing the configuration of an ESD (electro-static discharge) protection circuit that is provided for the purpose of preventing destruction caused by electrostatic discharge at the signal input portion of a semiconductor chip. The ESD protection circuit shown in FIG. 9B includes a PMOS transistor 101 and an NMOS transistor 102. In general, an IC based on the MOS structures is susceptible to static electricity. For example, as a man charged with electrostatic touches a terminal of a chip, charges are discharged through the semiconductor device, resulting in the destruction of the device. In order to prevent such destruction by electrostatic discharge, the ESD protection circuit as shown in FIG. 9D is provided at the input/output portion of a chip.

FIG. 9C shows an equivalent circuit to the ESD protection circuit shown in FIG. 9B. This equivalent circuit includes a diode 103 and a diode 104. As a potential at the internally-confined terminal 42 increases toward a positive potential due to electrostatic charge, the diode 103 becomes conductive, thereby allowing the charge to escape to the power supply voltage VDD. As the potential at the internally-confined terminal 42 decreases toward a negative potential due to electrostatic charge, the diode 104 becomes conductive, thereby allowing the charge to escape to the ground potential. Allowing the energy of electrostatic to escape to a power supply line in this manner can protect the semiconductor device.

As can be understood by inspecting the configuration of the ESD protection circuit shown in FIG. 9B, the configuration of transistors of this ESD protection circuit is the same as the configuration of transistors of the test circuit at the time of normal operation according to the present invention as shown in FIG. 9A. It is thus understood that the PMOS transistor 48-1 and NMOS transistor 49-1 of the test circuit of the present invention serve to provide the function of an ESD protection circuit at the time of normal operation.

Accordingly, in the configuration of the first chip 31 shown in FIG. 3, the PMOS transistors 48-1 through 48-4 and NMOS transistors 49-1 through 49-4 provided for the purpose of test operation of the present invention also serve as an ESD protection circuit. There is thus no need for an ESD protection circuit to be separately provided while such provision was necessary in the conventional art. In other words, there is no need in the fourth embodiment to provide an ESD protection circuit that was necessary in the related art. The forth embodiment can thus suppress a size increase resulting from the addition of the circuit of the present invention.

In the embodiments described above, a circuit dedicated for the purpose of setting internally-confined terminals to alternating HIGH and LOW is provided. The provision of the dedicated circuit makes it possible to set the internally-confined terminals to alternating HIGH and LOW by simply controlling the logic values of the test enable signal TestEN, the odd-number test enable signal TestOdd, and the even-number test signal TestEven by use of the core circuit. This is advantageous in that operations necessary for testing are simple.

Nonetheless, the present invention is not limited to the configuration in which such a dedicated circuit is provided. For example, instead of providing a dedicated circuit, data signals output from the core circuit (e.g., Data-1 through Data-4 of the above-described embodiments) may be set to alternating HIGH and LOW for the purpose of conducting a test. In this case, an operation for setting the data signals becomes necessary at the time of test operation, but the proposed configuration is advantageous in a sense that there is no need for a circuit dedicated for data setting.

Namely, the present invention only requires a circuit inside a chip that can be used to set the internally-confined terminals to alternating HIGH and LOW regardless of whether this circuit is a dedicated circuit for outputting setting signals at the time of test or is a core circuit that outputs data output signals.

Further, the above-described embodiments have been directed to an example in which the SiP configuration is used. Notwithstanding this, the present invention is equally applicable to a semiconductor device other than that of the SiP configuration. Namely, the present invention is applicable even if the chip is not provided in an SiP, or is not designed for use in an SiP, but is designed to be used alone. In this case, in order to make sure than there is no leak defect between chip terminals at the time of testing prior to shipment of the chip, an efficient leak defect check can be made by eliminating a series of operations such as bringing a probe or the like in contact with adjacent terminals to be checked, applying voltages, and measuring a current flowing between these terminals. Further, testing can be done even if the number of available pins of the testing apparatus is smaller than the number of signal pins (terminals) of the chip. This allows the use of an inexpensive testing equipment to be used, thereby achieving cost reduction.

Further, the present invention is not limited to these embodiments, but various variations and modifications may be made without departing from the scope of the present invention.

What is claimed is:

1. A semiconductor device, comprising:
a plurality of signal terminals;
a first power supply terminal;
a second power supply terminal separate from and independent of the first power supply terminal;
a core circuit coupled to said plurality of signal terminals and said first power supply terminal;
a plurality of first transistors coupled between the respective signal terminals and said second power supply terminal; and
a plurality of second transistors coupled between the respective signal terminals and a ground potential,
wherein said core circuit is configured to make said first transistors conductive and nonconductive alternately and make said second transistors nonconductive and conductive alternately at a time of test operation, such that one of a first transistor and a second transistor being conductive with respect to a given signal terminal requires another one of the first transistor and the second transistor to be nonconductive with respect to said given signal terminal.

2. The semiconductor device according to claim 1, wherein said plurality of signal terminals are operable to output signals from said core circuit to an exterior of said semiconductor device at a time of normal operation, and said core circuit is configured to set signal levels of said signals by controlling conductive/nonconductive states of said first transistors and said second transistors at the time of normal operation.

3. A semiconductor device, comprising:
a plurality of signal terminals;
a first power supply terminal;
a second power supply terminal;
a core circuit coupled to said plurality of signal terminals and said first power supply terminal;
a plurality of first transistors coupled between the respective signal terminals and said second power supply terminal; and
a plurality of second transistors coupled between the respective signal terminals and a ground potential;
a plurality of third transistors coupled between the respective signal terminals and a signal output power supply potential connected to said first power supply terminal,
wherein said core circuit is configured to make said first transistors conductive and nonconductive alternately and make said second transistors nonconductive and conductive alternately at a time of test operation, such that one of a first transistor and a second transistor being conductive with respect to a given signal terminal requires another one of the first transistor and the second transistor to be nonconductive with respect to said given signal terminal, and
wherein said plurality of signal terminals are operable to output signals from said core circuit to an exterior of said semiconductor device at a time of normal operation, and said core circuit is configured to set signal levels of said signals by controlling conductive/nonconductive states of said third transistors and said second transistors at the time of normal operation.

4. The semiconductor device as claimed in claim 1, wherein said first transistors and said second transistors are fixedly placed in a nonconductive state at times other than the time of test operation, thereby to provide an ESD protection function.

5. The semiconductor device as claimed in claim 1, further comprising a circuit coupled between one or more control signal outputs of said core circuit and gate nodes of said first transistors and said second transistors to make said first transistors conductive and nonconductive alternately and make said second transistors nonconductive and conductive signal outputs at the time of test operation.

6. The semiconductor device as claimed in claim 1, wherein said second power supply terminal is connected only to said first transistors.

7. A semiconductor device, comprising:
a first chip;
a second chip;
a package containing said first chip and said second chip, wherein said first chip includes:
a plurality of signal terminals connected to said second chip;
a first power supply terminal connected to an exterior of said package;
a second power supply terminal connected to an exterior of said package separate from and independent of the first power supply terminal;
a core circuit coupled to said plurality of signal terminals and said first power supply terminal;
a plurality of first transistors coupled between the respective signal terminals and said power supply terminal; and
a plurality of second transistors coupled between the respective signal terminals and a ground potential,
wherein said core circuit is configured to make said first transistors conductive and nonconductive alternately and make said second transistors nonconductive and conductive alternately at a time of test operation, such that one of a first transistor and a second transistor being conductive with respect to a given signal terminal requires another one of the first transistor and the second transistor to be nonconductive with respect to said given signal terminal.

8. The semiconductor device as claims in claim 7, wherein said plurality of signal terminals are operable to output signals from said core circuit to said second chip at a time of normal operation, and said core circuit is configured to set signal levels of said signal by controlling conductive/nonconductive states of said first transistors and said second transistors at the time of normal operation.

9. A semiconductor device, comprising:

a first chip;

a second chip;

a package containing said first chip and said second chip, wherein said first chip includes:

a plurality of signal terminals connected to said second chip;

a first power supply terminal connected to an exterior of said package;

a second power supply terminal connected to an exterior of said package;

a core circuit coupled to said plurality of signal terminals and said first power supply terminal;

a plurality of first transistors coupled between the respective signal terminals and said power supply terminal; and a plurality of second transistors coupled between the respective signal terminals and a ground potential, wherein said core circuit is configured to make said first transistors conductive and nonconductive alternately and make said second transistors nonconductive and conductive alternately at a time of test operation, such that one of a first transistor and a second transistor being conductive with respect to a given signal terminal requires another one of the first transistor and the second transistor to be nonconductive with respect to said given signal terminal, wherein said first chip further includes a plurality of third transistors coupled between the respective signal terminals and a signal output power supply potential, and wherein said plurality of signal terminals are operable to output signals from said core circuit to an exterior of said semiconductor device at a time of normal operation, and said core circuit is configured to set signal levels of said signals by controlling conductive/nonconductive states of said third transistors and said second transistors at the time of normal operation.

10. The semiconductor device as claimed in claim 7, wherein said signal terminals are not connected to an exterior of said package.

* * * * *